（12）United States Patent
Fujimori (10) Patent No.: US 9,520,428 B2
(45) Date of Patent: Dec. 13, 2016

(54) IMAGE PICKUP APPARATUS (71) Applicant: OLYMPUS CORPORATION, Tokyo (JP)

(72) Inventor: Noriyuki Fujimori, Suwa (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/918,843

(22) Filed: Oct. 21, 2015

(65) Prior Publication Data

US 2016/0043122 A1   Feb. 11, 2016

Related U.S. Application Data (63) Continuation of application No. PCT/JP2014/059257, filed on Mar. 28, 2014.

(30) Foreign Application Priority Data

Apr. 26, 2013 (JP) .................................. 2013-094284
Apr. 26, 2013 (JP) .................................. 2013-094285

(51) Int. Cl.
*H01L 27/00* (2006.01)
*H01L 27/146* (2006.01)

(52) U.S. Cl.
CPC ... *H01L 27/14618* (2013.01); *H01L 27/14623* (2013.01); *H01L 27/14627* (2013.01); *H01L 27/14636* (2013.01); *H01L 27/14685* (2013.01); *H01L 2924/0002* (2013.01)

(58) Field of Classification Search
CPC .................. H01L 27/14618; H01L 27/14685; H01L 27/14623; H01L 27/14627; H01L 27/14636; H01L 2924/0002; H01L 2924/00

See application file for complete search history.

(56) References Cited

U.S. PATENT DOCUMENTS

| 9,117,814 B2* | 8/2015 | Yamamichi ....... H01L 23/49838 |
| 9,443,912 B2* | 9/2016 | Hatano ................. H01L 27/307 |
| 2002/0135788 A1* | 9/2002 | Arakawa ............ G03C 1/49881 |
| | | 358/1.1 |

(Continued)

FOREIGN PATENT DOCUMENTS

| JP | 2001-094843 A | 4/2001 |
| JP | 2008-078382 A | 4/2008 |

(Continued)

OTHER PUBLICATIONS

International Search Report dated May 27, 2014 issued in PCT/JP2014/059257.

*Primary Examiner* — Nikolay Yushin
(74) *Attorney, Agent, or Firm* — Scully, Scott, Murphy & Presser, P.C.

(57) ABSTRACT

An image pickup apparatus includes an image pickup device chip having a first primary surface on which an image pickup section, a circuit section and a guard ring are formed, the circuit section having a plurality of layers including an insulating layer that is made of a low dielectric constant material having a relative dielectric constant lower than silicon oxide, the guard ring being made of one or more materials selected from materials superior to the low dielectric constant material in humidity resistance; and a cover glass adhered to the first primary surface of the image pickup device chip.

14 Claims, 8 Drawing Sheets

(56) References Cited

U.S. PATENT DOCUMENTS

| | | | |
|---|---|---|---|
| 2009/0065888 A1* | 3/2009 | Kato | H01L 27/0629 257/476 |
| 2009/0295979 A1 | 12/2009 | Matsuo et al. | |
| 2012/0217374 A1 | 8/2012 | Nishizawa | |
| 2013/0033628 A1* | 2/2013 | Yamaguchi | H01L 27/14632 348/294 |
| 2013/0105667 A1 | 5/2013 | Kobayashi | |
| 2014/0231782 A1* | 8/2014 | Imai | H01L 51/448 257/40 |
| 2015/0041781 A1* | 2/2015 | Hatano | H01L 27/307 257/40 |

FOREIGN PATENT DOCUMENTS

| | | |
|---|---|---|
| JP | 2008-130738 A | 6/2008 |
| JP | 2009-290000 A | 12/2009 |
| JP | 2011-060933 A | 3/2011 |
| JP | 2011-166080 A | 8/2011 |
| JP | 2012-033718 A | 2/2012 |
| JP | 2012-033894 A | 2/2012 |
| JP | 2012-178496 A | 9/2012 |
| WO | WO 2012/001935 A1 | 1/2012 |

\* cited by examiner

IMAGE PICKUP APPARATUS

CROSS REFERENCE TO RELATED APPLICATION

This application is a continuation application of PCT/JP2014/059257 filed on Mar. 28, 2014 and claims benefit of Japanese Applications No. 2013-094284 filed in Japan on Apr. 26, 2013, and No. 2013-094285 filed in Japan on Apr. 26, 2013, the entire contents of each of which are incorporated herein by their reference.

BACKGROUND OF INVENTION

1. Field of the Invention

The present invention relates to an image pickup apparatus provided with an image pickup device chip on which an image pickup section and a circuit section including a low-dielectric-constant material layer are formed.

2. Description of the Related Art

An image pickup apparatus of a chip size package type, which is provided with an image pickup device chip having a primary surface on which an image pickup section is formed, has a small diameter and therefore is used in an endoscope and the like, the image pickup section being comprised of a CMOS image pickup device, etc. In order to make the image pickup section composed of fine patterns manufactured by a semiconductor technique be in consistency with junction electrodes which are large and to which signal cables and so forth are connected, a re-wiring circuit including a conductive layer and an insulating layer is essential in the image pickup device chip. In recent years, so as to improve performance of the image pickup apparatus, it has been considered to use a material having a dielectric constant lower than silicon oxide, which is so called as a low-k material, as the insulating layer of the re-wiring circuit.

In Japanese Patent Laid-Open Publication No. 2008-78382, there is disclosed a semiconductor apparatus in which a side surface of the re-wiring circuit including the low-dielectric-constant material layer of the semiconductor device chip is covered and sealed by an under-fill material superior to the low dielectric constant material in humidity resistance.

Further, in Japanese Patent Laid-Open Publication No. 2011-166080, there is disclosed an image pickup apparatus in which an image pickup device chip is housed in a shield case. A sealing resin is filled in a gap between the image pickup device chip and the shield case.

SUMMARY OF THE INVENTION

An image pickup apparatus in an embodiment includes: an image pickup device chip having a first primary surface on which an image pickup section, a circuit section, electrode pads and a guard ring are formed, and a second primary surface on which junction terminals are formed, the circuit section transmitting and receiving a signal to and from the image pickup section and having a plurality of layers including an insulating layer that is made of a low dielectric constant material having a relative dielectric constant lower than silicon oxide, the electrode pads being connected with the circuit section, the guard ring enclosing the image pickup section, the circuit section and the electrode pads and being made of one or more materials selected from materials superior to the low dielectric constant material in humidity resistance, the junction terminals being connected with the electrode pads via through wirings; a transparent member adhered to the first primary surface of the image pickup device chip via a transparent adhesive layer and having the same dimensions as the image pickup device chip in a plan view; and a post ring disposed between an entire circumference of the guard ring and the transparent member and made of a material superior to a material of the guard ring in humidity resistance.

Further, an image pickup apparatus in another embodiment includes: an image pickup device chip having a first primary surface on which an image pickup section, a circuit section, junction electrodes and a guard ring are formed, the circuit section transmitting and receiving a signal to and from the image pickup section and having a plurality of layers including an insulating layer that is made of a low dielectric constant material having a relative dielectric constant lower than silicon oxide, the junction electrodes being connected with the circuit section, the guard ring enclosing the image pickup section, the circuit section and the junction electrodes and being made of a material superior to the low dielectric constant material in humidity resistance; leads connected with the junction electrodes; a sealing member that seals junction portions between the junction electrodes and the leads; and a transparent member adhered to the first primary surface of the image pickup device chip via an adhesive layer so as to cover a portion of the guard ring not covered by the sealing member.

Further, an image pickup apparatus in still another embodiment includes: an image pickup device chip that has a rectangular shape in a plan view and has a first primary surface on which an image pickup section and a circuit section are formed, and a second primary surface on which junction terminals are formed, the circuit section transmitting and receiving a signal to and from the image pickup section and having a plurality of layers including an insulating layer that is made of a low dielectric constant material having a relative dielectric constant lower than silicon oxide, the junction terminals being connected with the circuit section via through wirings; a cover glass adhered to the first primary surface of the image pickup device chip and having the same dimensions as the image pickup device chip in a plan view; a shield case in which the image pickup device chip is housed, an inner wall of the shield case having a cross sectional shape formed by a curved line at a corner portion; and a sealing resin that fills a gap between a side surface of the image pickup device chip and the shield case, the sealing resin having thickness not greater than 100 µm except the corner portion.

DETAILED DESCRIPTION OF THE PREFERRED EMBODIMENT(S)

First Embodiment

Figure 1:
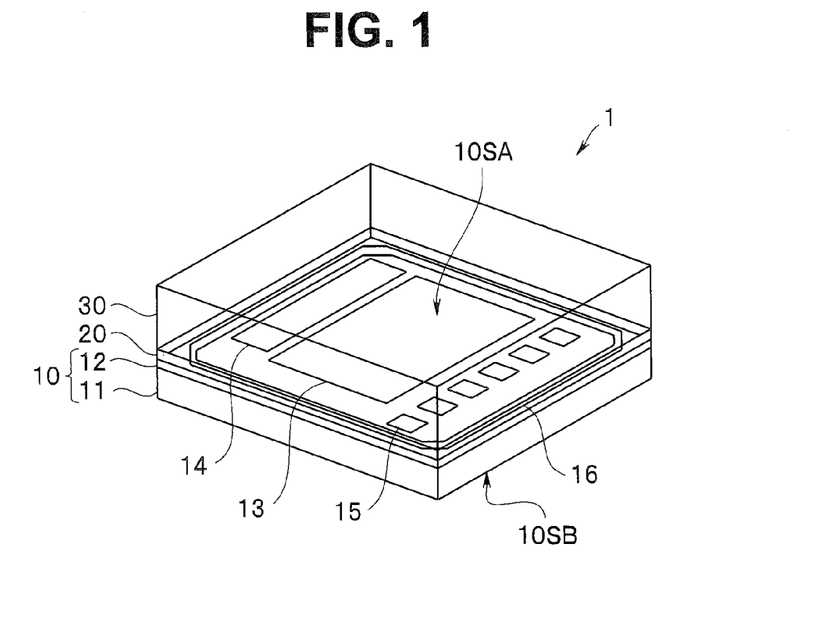
FIG. 1 is a perspective view of an image pickup apparatus according to a first embodiment.
Figure 2:
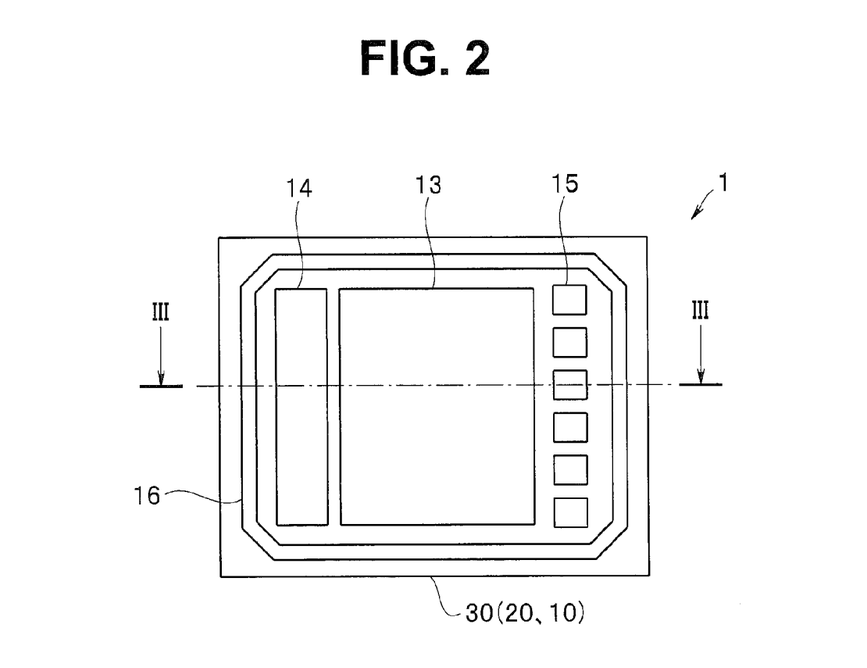
FIG. 2 is a top view of the image pickup apparatus according to the first embodiment.
Figure 3:
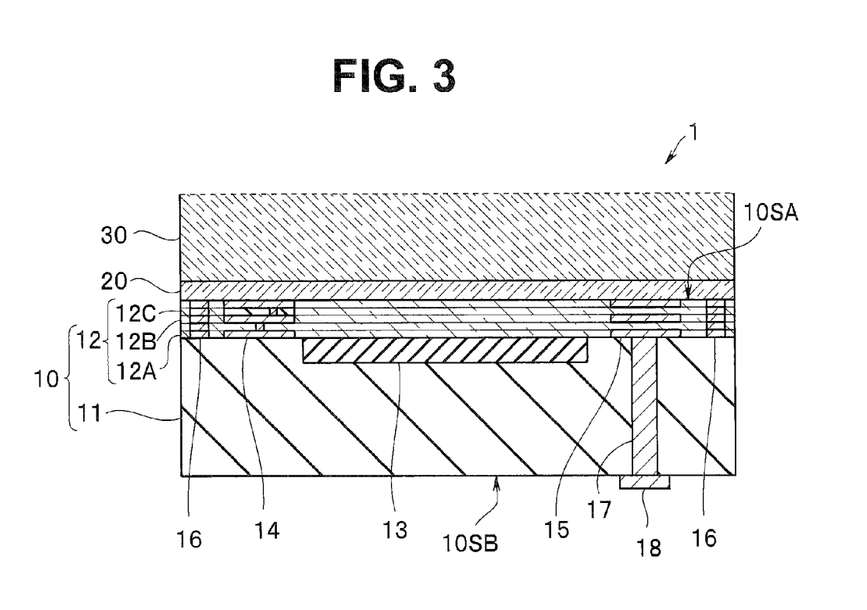
FIG. 3 is a cross sectional view of the image pickup apparatus according to the first embodiment along the line in FIG. 2.

As shown in FIGS. 1-3, an image pickup apparatus 1 of the first embodiment is provided with an image pickup device chip 10, a cover glass 30 which is a transparent member, and a transparent adhesive layer 20 which adheres the image pickup device chip 10 and the cover glass 30.

The image pickup device chip 10, which is comprised of a semiconductor substrate 11 having a laminated film 12 disposed on a primary surface, is a chip of a wafer level chip size package type, and the image pickup device chip 10 and the cover glass 30 have the same dimensions in a plan view. That is, the image pickup apparatus 1 is manufactured by cutting a joined wafer into individual pieces, the joined wafer having configuration such that an image pickup device wafer, on which a plurality of image pickup device chips 10 are formed and a glass wafer are adhered. The image pickup device chip 10 can be made in a lump, and is therefore excellent in productivity.

On a first primary surface 10SA of the image pickup device chip 10, an image pickup section 13, a circuit section 14, a plurality of electrode pads 15 and a guard ring 16 are formed. On the other hand, on a second primary surface 10SB of the image pickup device chip 10, there are formed a plurality of junction terminals 18 which are respectively connected with the electrode pads 15 via through wirings 17.

The image pickup section 13 comprised of a CMOS image pickup device or the like is formed on the primary surface of the semiconductor substrate 11 made of silicon or the like by a known semiconductor manufacturing technique.

The circuit section 14 has a re-wiring function for transmitting and receiving signals or the like to and from the image pickup section 13. The circuit section 14 may include a semiconductor circuit that processes the signal of the image pickup section 13. In this case, the semiconductor circuit is formed on the primary surface of the semiconductor substrate 11 comprised of silicon or the like by the known semiconductor manufacturing technique in the same manner as the image pickup section 13. The circuit section 14 is a part of the laminated film 12 including a plurality of conductive layers 12A and a plurality of insulating layers 12B, 12C. It is noted that in FIG. 3, a part of the plurality of layers is schematically shown.

Further, at least one insulating layer 12C of the circuit section 14 is made of a low dielectric constant material (a low-k material). The electrode pads 15 are connected with the image pickup section 13 through the circuit section 14.

Besides, it may be configured that the plurality of conductive layers 12A are made of different materials. Further, it may be configured that the plurality of insulating layers 12B are made of different materials. Then, at least one insulating layer 12C is made of the low dielectric constant material (the low-k material).

The low dielectric constant material is a material having a relative dielectric constant k lower than silicon oxide (k=4.0) and is preferably a material having the relative dielectric constant k not greater than 3.0. A lower limit value of the relative dielectric constant k of the low dielectric constant material is not smaller than 2.0 and is preferably not smaller than 1.5 due to a technical limit.

In the image pickup apparatus 1, the low dielectric constant material of the insulating layer 12C is porous SiOC (k=2.7). The porous SiOC is methyl-containing polysiloxane which mainly contains a number of Si—CH$_3$ groups and is porous since gaps are formed in a molecular structure because of presence of CH$_3$, and has the relative dielectric constant k which is relatively low.

As the material of the insulating layer 12C, an SiOF or SiOCH based porous material, a silica based porous material such as a nano clustering silica film, H-containing polysiloxane which is called as porous HSQ, or an organic polymer or a porous material of an organic polymer, or the like may be used.

The guard ring 16 enclosing the image pickup section 13, the circuit section 14 and the electrode pads 15 is a humidity prevention wall which blocks permeation of water into a region inside an inner periphery of the guard ring 16. As already described, the insulating layer 12C made of the low dielectric constant material does not have sufficient humidity resistance. The guard ring 16 is made of a material superior to the low dielectric constant material in humidity resistance and blocks permeation of water into the low dielectric constant material inside the guard ring 16.

The material of the guard ring 16 is selected from materials superior to the low dielectric constant material in humidity resistance in accordance with manufacturing steps, and specifications of the image pickup apparatus 1. In the image pickup apparatus 1, the guard ring 16 and the circuit section 14 are a part of the laminated film 12 and the guard ring 16 is formed simultaneously when the circuit section 14 is formed on the semiconductor substrate 11. That is, the guard ring 16 is comprised of a ring-like laminated film which is framed by a plurality of laminated layers in accordance with forming steps of the circuit section 14 having the plurality of layers.

When the insulating layer 12C is laminated on the circuit section 14, the same low-dielectric-constant material layer as the insulating layer 12C is not laminated in the guard ring 16. For example, the guard ring 16 may be formed by laminating layers excluding the insulating layer 12C when forming the circuit section 14. On the other hand, in a case where the circuit section 14 is constituted by the plurality of conductive layers 12A and the plurality of insulating layers 12C only, the guard ring 16 is formed by the plurality of conductive layers 12A.

Further, a part of the guard ring 16 may be constituted by a layer which is integral with a constituting layer of the circuit section 14. For example, an extended portion of the insulating layer 12B may constitute one layer of the guard ring 16.

The guard ring 16 is made of one or more materials selected from a plurality of materials that compose the circuit section 14. For example, the conductive layers 12A of the circuit section 14 are made of metal such as copper and therefore excellent in humidity resistance. Then, when forming the plurality of conductive layers 12A, the guard ring 16 having laminated copper layers is formed simultaneously.

Further, in a case where the insulating layer 12B of the circuit section 14 is made of silicon oxide, silicon nitride or the like, when forming the plurality of insulating layers 12B, the guard ring 16 having laminated layers of silicon oxide or the like is formed simultaneously.

Further, the guard ring 16 may be laminated layers including a copper layer and a silicon oxide layer, for example. That is, the guard ring 16 may be constituted by a plurality of layers made of a plurality of different materials.

The layer made of the low dielectric constant material which constitutes the insulating layer 12C preferably does not exist outside the guard ring 16, but may exist outside the guard ring 16. This is because the permeation of water into the inside of the guard ring 16 is prevented.

The guard ring may be disposed after the circuit section 14 (the laminated film 12) is formed. For example, a groove portion is provided as a guard ring disposition portion when forming the laminated film 12, and before adhesion of the cover glass, an O-ring as the guard ring may be fitted into the groove portion. The guard ring may have a double structure comprised of an inner ring and an outer ring.

Further, the cover glass 30 which is a transparent member adhered to the first primary surface 10SA of the image pickup device chip 10 through the adhesive layer 20 has the same dimensions in a plan view as the image pickup device chip 10. Therefore, the cover glass 30 covers a region inside an outer periphery of the guard ring 16. The transparent member may be made of resin or the like as long as the transparent member has high transmittance in a wavelength region of light which is received by the image pickup section 13. The cover glass 30 having sufficient thickness blocks the permeation of water into the circuit section 14, etc. from above. It is noted that the cover glass 30 may cover at least the region inside the outer periphery of the guard ring 16.

The adhesive layer 20 is made of a transparent resin such as epoxy resin, silicone resin, etc. which is superior to the low dielectric constant material of the insulating layer 12C in humidity resistance.

The low-k material is inferior to a conventional insulating layer material in humidity resistance, i.e. in water-vapor permeability. There is a fear that reliability of the image pickup apparatus of the chip size package type with the insulating layer made of the low-k material is not sufficient since the low-k material is exposed at an outer circumferential portion. That is, if water permeates the insulating layer made of the low-k material, a relative dielectric constant rises and a parasitic capacitance increases to cause a signal delay, and therefore there is a fear that malfunction occurs or erosion of metal wirings occurs.

The image pickup section 13, the circuit section 14, the electrode pads 15, etc. formed on the first primary surface 10SA of the image pickup apparatus 1 are configured such that permeation of water from a side surface is blocked by the guard ring 16 and permeation of water from an upper surface is blocked by the cover glass 30. Therefore, the image pickup apparatus 1 has high reliability although the apparatus is a chip-size package which has small dimensions in a plan view and is excellent in productivity.

Characteristics of the image pickup apparatus 1 are not deteriorated after the apparatus is left in a high temperature and high humidity environment, for example at temperature of 85° C. and humidity of 85% for 1000 hours.

Further, productivity of the image pickup apparatus 1 is high since the guard ring 16 is formed simultaneously, when forming the circuit section 14 as a part of the laminated film 12, as another part of the laminated film 12.

Second Embodiment

Figure 4:
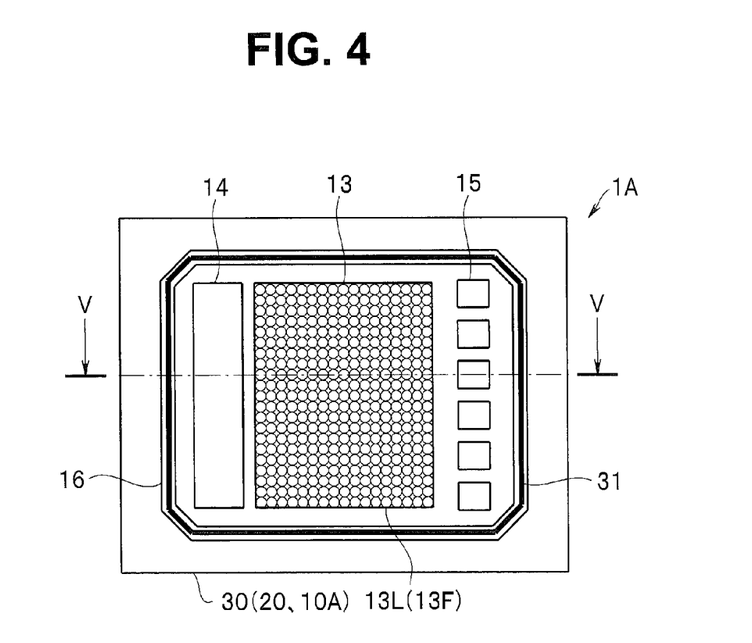
FIG. 4 is a top view of the image pickup apparatus according to a second embodiment.
Figure 5:
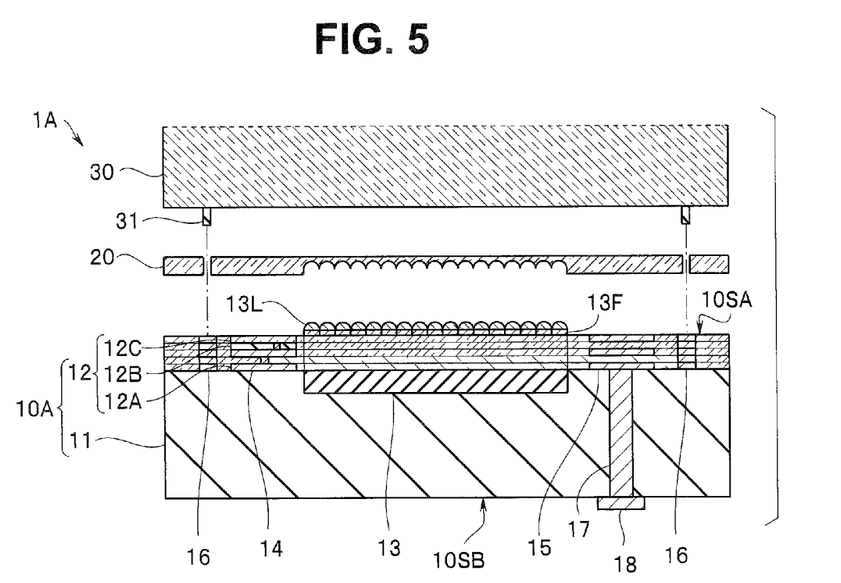
FIG. 5 is an exploded cross sectional view of the image pickup apparatus according to the second embodiment along the line V-V in FIG. 4.

Next, an image pickup apparatus 1A of the second embodiment will be described. The image pickup apparatus 1A is similar to the image pickup apparatus 1, and therefore the same reference signs are assigned to the same elements and the description thereof is omitted.

In the image pickup apparatus 1, permeation of water into the image pickup section 13, etc. from the side surface is prevented by the guard ring 16. However, an end face of the adhesive layer 20, which is extended to a central region where the image pickup section 13 is formed, is exposed on the side surface of the image pickup apparatus 1. The humidity resistance of the adhesive layer is not bad. However, since the adhesive layer 20 is required to have high light transmittance in dependence on specifications of the image pickup apparatus, there is a case where it is difficult to use a material having sufficiently high humidity resistance. Therefore, there has been a fear that water permeates into the image pickup section 13, etc. through the adhesive layer 20 in dependence on use environment.

In contrast, as shown in FIGS. 4 and 5, a post ring 31 is sandwiched between the guard ring 16 and the cover glass 30 in the image pickup apparatus 1A. The post ring 31 has a ring shape which continues along an upper surface of the guard ring 16 without a break. Since the post ring 31 is disposed between the upper surface of the guard ring 16 and the cover glass 30, the adhesive layer 20 is completely divided into a central part and an outer peripheral part by the post ring 31.

The post ring 31 is made of a material which is further superior in humidity resistance to the material of the adhesive layer 20 which is superior in humidity resistance to the low dielectric constant material. For example, the post ring 31 is made of metal such as copper, nickel and aluminum, or made of an inorganic substance such as silicon oxide.

It is preferable that the post ring 31 is formed on the cover glass 30 before the cover glass 30 and the image pickup device chip 10A are adhered to each other. For example, the post ring 31 having the ring shape and a desired thickness is formed by forming a metal film on the cover glass 30 by an evaporation method and patterning the film.

The image pickup apparatus 1A has the advantageous effects of the image pickup apparatus 1, and further has higher reliability since permeation of water through the adhesive layer 20 is prevented by the post ring 31.

Besides, in the image pickup apparatus 1A, a color filter 13F and a micro lens 13L are disposed on the image pickup section 13 of the image pickup device chip 10A.

Modified Example of Second Embodiment

Figure 6:
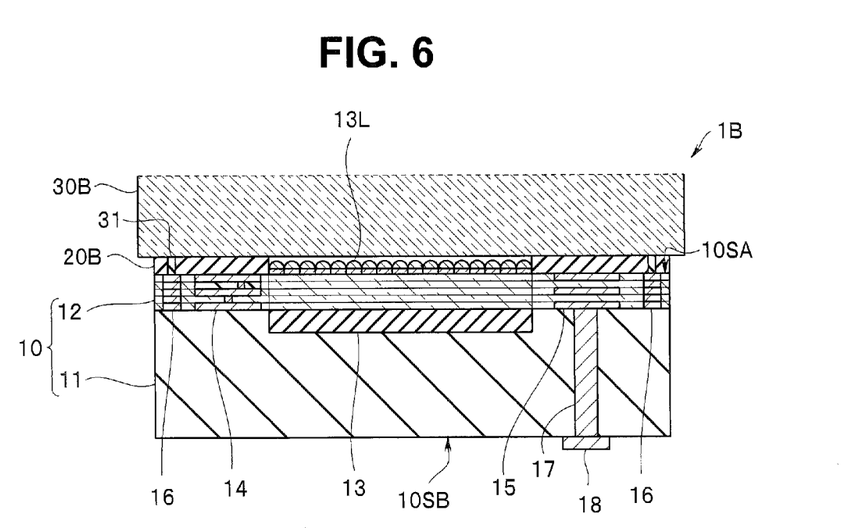
FIG. 6 is a cross sectional view of a modified example of the image pickup apparatus according to the second embodiment.

In an image pickup apparatus 1B as shown in FIG. 6 according to a modified example of the second embodiment, dimensions of the cover glass 30 in a plan view are larger than dimensions of the image pickup device chip 10 in a plan view.

That is, as long as the cover glass 30 covers the region inside the outer periphery of the guard ring 16, permeation of water into the circuit section 14 which is formed in the inside region. That is, the same advantageous effects as the image pickup apparatus 1 are obtained irrespective of whether the dimensions of the cover glass in a plan view is larger or smaller than the dimensions of the image pickup device chip 10 in a plan view when the dimensions of the cover glass in a plan view are larger than the dimensions of the outer periphery of the guard ring 16 in a plan view.

It is noted that the adhesive layer 20B is not disposed between the micro lens 13L and the cover glass 30. Therefore, light condensing efficiency of the micro lens 13L is increased and sensitivity is high. Besides, since the adhesive layer 20B is not disposed on an upper side of the image pickup section 13, the adhesive layer is not required to be transparent and may be resin or the like having a light shielding function.

Third Embodiment

Figure 7:
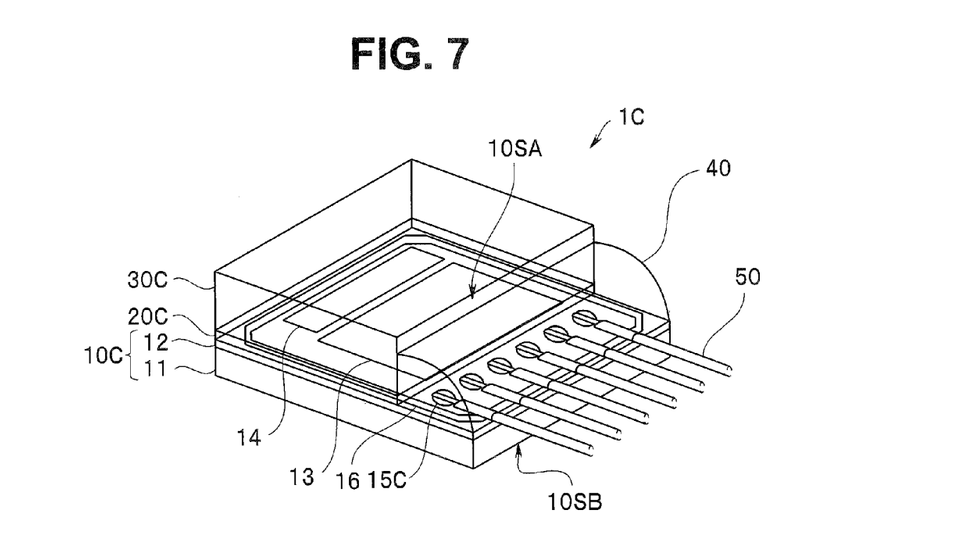
FIG. 7 is a perspective view of an image pickup apparatus according to a third embodiment.
Figure 8:
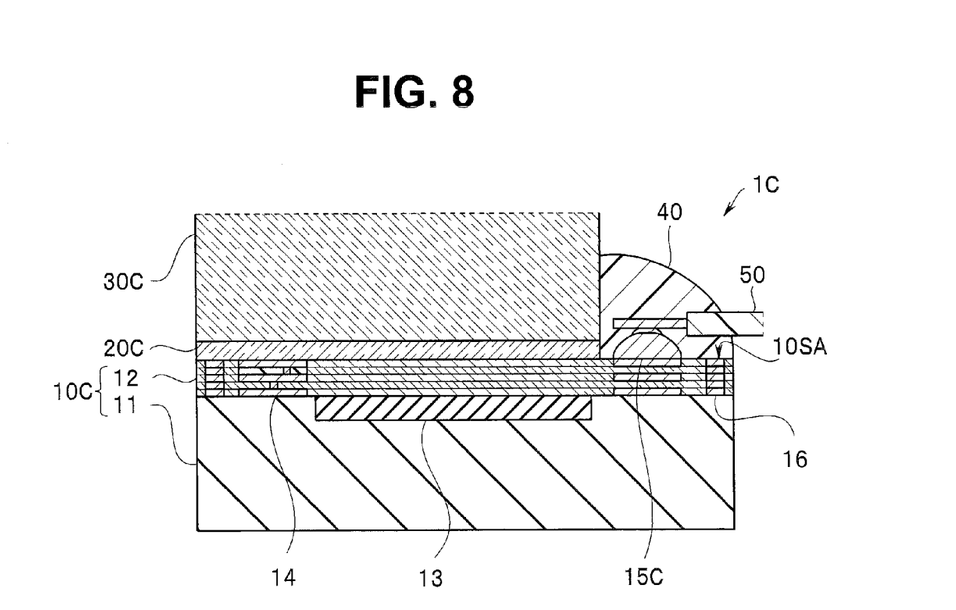
FIG. 8 is a cross sectional view of the image pickup apparatus according to the third embodiment.

Next, an image pickup apparatus 1C of the third embodiment will be described. The image pickup apparatus 1C is similar to the image pickup apparatuses 1, 1A and 1B, and therefore the same reference signs are assigned to the same elements and the description thereof is omitted.

As shown in FIG. 7 and FIG. 8, in the image pickup apparatus 1C, junction electrodes 15C which are bumps connected with the circuit section 14 are formed on the first primary surface 10SA of an image pickup device chip 10C. Signal extracting leads 50 that transmit input and output signals to and from the image pickup section 13 are connected to the junction electrodes 15C.

Further, a region not covered by the cover glass 30C via the adhesive layer 20C is sealed by a sealing resin 40. The sealing resin 40 is selected from materials excellent in humidity resistance, such as epoxy resin or silicone resin. It is noted that the sealing resin 40 is depicted as a transparent material in FIG. 7, etc., but may be a light shielding material.

In the image pickup apparatus 1C, a right-angle prism or the like may be disposed in place of the cover glass 30C.

The guard ring 16 encloses the image pickup section 13, the circuit section 14 and the cover glass 30C. The upper surface of the guard ring 16 is partially covered by the cover glass 30C and a portion not covered by the cover glass 30C is covered by the sealing resin 40.

Thus, the image pickup apparatus 1C has the same advantageous effects as the image pickup apparatus 1, etc. Further, the image pickup apparatus 1C is manufactured more easily than the image pickup apparatus 1, etc. since it is not necessary to form the through wirings or the like.

Figure 9:
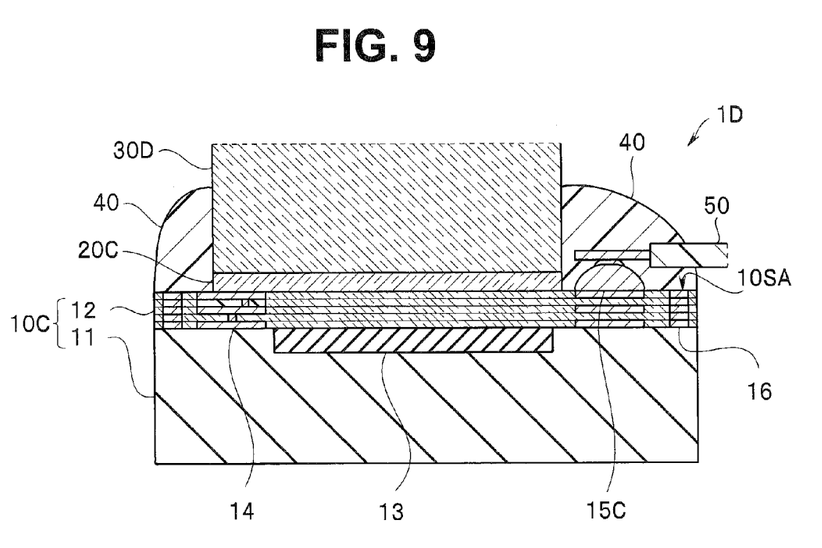
FIG. 9 is a cross sectional view of a modified example of the image pickup apparatus according to the third embodiment.

Next, an image pickup apparatus 1D according to a modified example of the third embodiment is shown in FIG. 9. The image pickup apparatus 1D is similar to the image pickup apparatus 1C, but an outer circumferential portion of the first primary surface 10SA of the image pickup device chip 10C outside the image pickup section 13 is not covered by a cover glass 30D.

Specifically, an outer circumferential portion other than a portion in a region where the junction electrodes 15C are formed is not covered by the cover glass 30D. However, on the outer circumferential portion not covered by the cover glass 30D, an upper surface of the guard ring 16 is covered by the sealing resin 40 in the same manner as the region in which the junction electrodes 15C are formed.

In the image pickup apparatus 1D, the upper surface of the guard ring 16 is partially covered by the cover glass 30D and parts not covered by the cover glass 30D are covered by the sealing resin 40 in the same manner as in the image pickup apparatus 1C.

The image pickup apparatus 1D in which the region inside the outer periphery of the guard ring 16 is completely covered by the cover glass 30D and the sealing resin 40 has the same advantageous effects as the image pickup apparatus 1, etc. Further, the image pickup apparatus 1D has a high degree of freedom in dimensions, a shape, etc. of the cover glass 30D, and design planning and structural design thereof are easy.

Besides, in the image pickup apparatus 1D, among outer circumferential regions in four directions centering around the rectangular image pickup section 13, two regions, i.e. the region where the junction electrodes 15C are formed and a region that opposes the region where the junction electrodes 15C are formed with the image pickup section 13 intervened therebetween, are not covered by the cover glass 30D. However, it is needless to say that, among the outer circumferential regions in four directions, if it is configured such that two regions, three regions or four regions including the junction electrode forming region are not covered by the cover glass 30D, the same advantageous effects as the image pickup apparatus 1D are obtained as long as the upper surface of the guard ring 16 in these regions is covered by the sealing resin 40.

Fourth Embodiment

Figure 10:
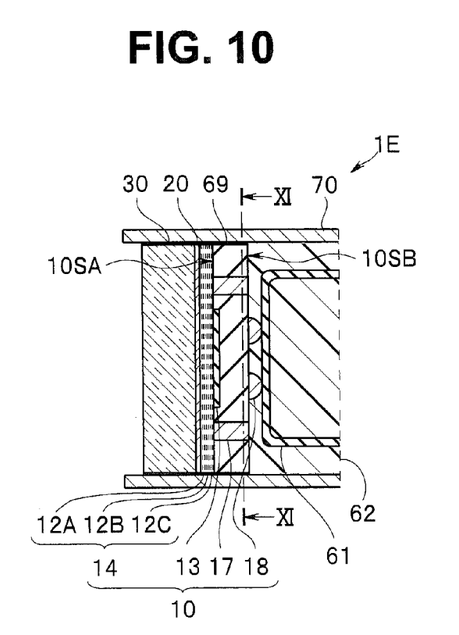
FIG. 10 is a cross sectional view of an image pickup apparatus according to a fourth embodiment.
Figure 11:
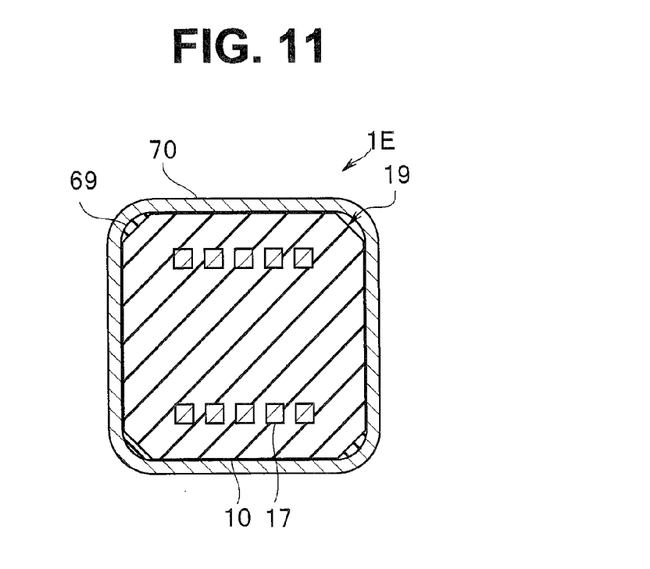
FIG. 11 is a cross sectional view of the image pickup apparatus according to the fourth embodiment along the line XI-XI in FIG. 10.
Figure 12:
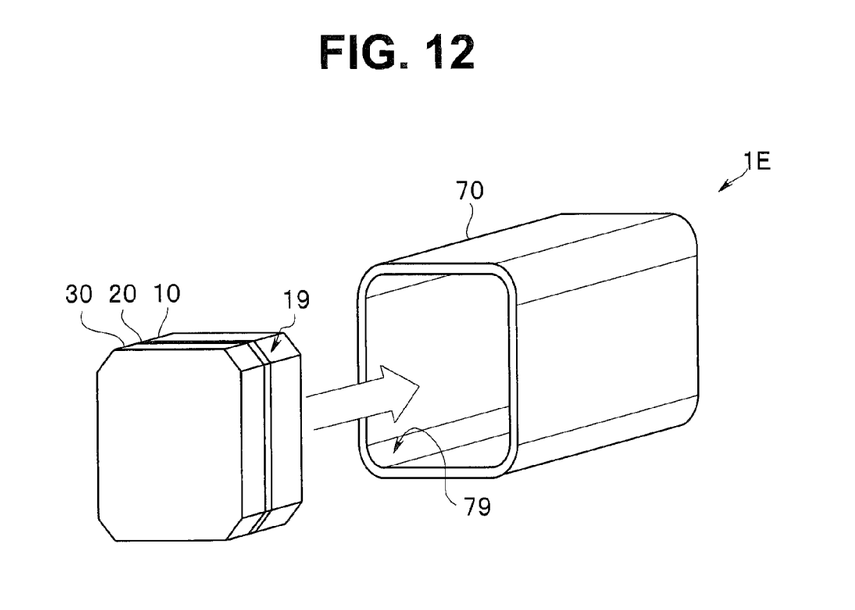
FIG. 12 is a perspective view for explaining the image pickup apparatus according to the fourth embodiment.

As shown in FIGS. 10-12, an image pickup apparatus 1E of the fourth embodiment is provided with the image pickup device chip 10, the cover glass 30, a shield case 70 in which the image pickup device chip 10 is housed, and a sealing resin 69 which fills a gap between a side surface of the image pickup device chip 10 and an inner wall of the shield case 70.

On the first primary surface 10SA of the image pickup device chip 10, the image pickup section 13 and a circuit section 14 comprised of a plurality of layers 12A, 12B and 12C are formed. Besides, in FIG. 10, it is depicted as if the circuit section 14 is formed on the entirety of the first primary surface 10SA, but a functional portion of the circuit section 14 is not formed over the image pickup section 13. For example, over the image pickup section 13, there are formed the insulating layer 12A, etc. which are made of the transparent material and do not prevent light receiving, and constitute the circuit section 14. Further, on the second primary surface 10SB of the image pickup device chip 10, there are formed a plurality of junction terminals 36 which are respectively connected with the circuit section 14 via through wirings 35.

Further, on the first primary surface 10SA of the image pickup device chip 10, the cover glass 30, which is a transparent member, is adhered via the adhesive layer 20. The adhesive layer 20 is made of the transparent resin such as epoxy resin, silicone resin, etc. Further, a wiring board 61 is joined to the junction terminals 36 on the second primary surface 10SB of the image pickup device chip 10. A sealing resin 62 is filled inside the shield case 70 on a side of the second primary surface of the image pickup device chip 10. The sealing resin 62 is selected from resins which are excellent in humidity resistance, such as epoxy resin, silicone resin, etc.

The image pickup section 13 is a CMOS image pickup device or the like which is manufactured on a silicon substrate using a semiconductor manufacturing technique. The circuit section 14 has a re-wiring function for sending and receiving signals or the like of the image pickup section 13, and has a multi-layered structure in which the plurality of conductive layers 12A and the plurality of insulating layers 12B, 12C are laminated. Besides, the circuit section 14 may include a signal processing circuit which is manufactured on the silicon substrate using the semiconductor manufacturing technique in the same manner as the image pickup section 13. Thus, the insulating layers of the circuit section 14 include the insulating layer 12C made of the low dielectric constant material.

Specifically, insulating materials of the plurality of insulating layers may be comprised of materials different from each other. Then, at least one insulating layer 12C is made of the low dielectric constant material (the low-k material). Here, the low dielectric constant material is a material having the relative dielectric constant k lower than silicon oxide (k=4.0), and may be a material having the relative dielectric constant k preferably not greater than 3.0 and more preferably not greater than 2.7. A lower limit value of the dielectric constant k of the low dielectric constant material is not smaller than 1.5 and is preferably not smaller than 2.0 due to a technical limit.

In the image pickup apparatus 1E, the low dielectric constant material of the insulating layer 12C is a carbon-doped silicon oxide film (SiOC). SiOC is methyl-containing polysiloxane which mainly contains a number of Si—CH$_3$ groups and can be made porous since gaps are formed in a molecular structure because of presence of CH$_3$, and it is possible to make the relative dielectric constant k not greater than 2.7.

As the material of the insulating layer 12C, a fluorine-doped silicon oxide film (SiOF/FSG), a hydrogen-containing polysiloxane (HSQ) based polymer, a methyl-containing polysiloxane (MSQ) based polymer, an organic polymer (a polyimide, parylene or Teflon (registered trademark) polymer), etc. can be used in addition to SiOC, and an insulating layer having a lower dielectric constant can be configured by forming these materials into a porous body, to have air gaps or the like.

Figure 13:
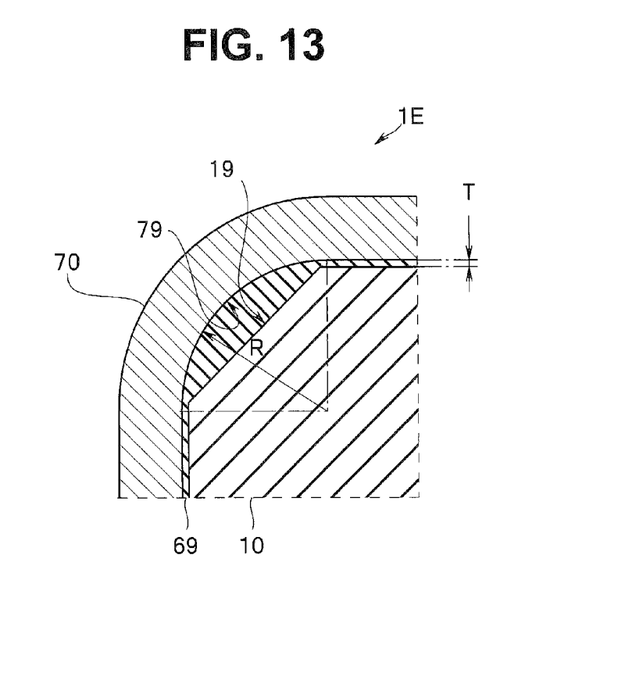
FIG. 13 is a partially enlarged sectional view of the image pickup apparatus according to the fourth embodiment as shown in FIG. 11.

The shield case 70 is made of metal such as stainless steel, and has a light shielding function and an electromagnetic noise resistance improving function and also has a high humidity resistance to prevent permeation of water. A cross sectional shape of inner and outer walls of the shield case 70 is approximately rectangular. It is noted that the cross sectional shape refers to a sectional shape in a direction orthogonal to a longitudinal direction (an optical axis direction of the image pickup section). However, strictly speaking, a cross sectional shape of a corner portion 79 of the inner wall is formed by a curved line having a radius of curvature R, as shown in FIG. 13.

The image pickup device chip 10 is the chip of the wafer level chip size package type which is manufactured by cutting a silicon wafer, on which a plurality of image pickup sections 13, etc. are formed, and a glass wafer adhered to the silicon wafer, into individual pieces.

The image pickup device chip 10 of the wafer level chip size package type has small dimensions in a plan view, but a side surface of the insulating layer 12C which is made of the low dielectric constant material is exposed on an outer circumferential portion. Further, shapes and dimensions of the cover glass 30, the adhesive layer 20 and the image pickup device chip 10 in a plan view, i.e. shapes and dimensions in cross sections thereof, are the same and corner portions have right angles.

Figure 14:
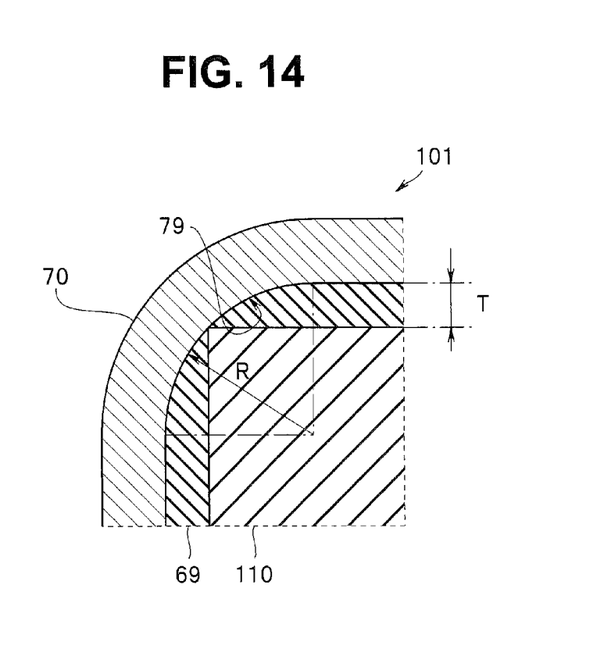
FIG. 14 is a partially enlarged sectional view of a conventional image pickup apparatus.

As shown in FIG. 14, in a conventional image pickup apparatus 101, an outer circumferential portion of an image pickup device chip 110 is wound by the shield case 70 in the same manner as in the image pickup apparatus 1E. However, there is formed a large gap between the image pickup device chip 110 with corner portions each having a cross sectional shape of a right angle, and the shield case 70 with corner portions each having a cross sectional shape formed by a curved line. Therefore, a thickness T of the sealing resin 69 filled in a gap between the image pickup device chip 110 and the shield case 70 is large.

For example, in a case where the radius of curvature R of the cross sectional shape of the corner portion 79 is 500 μm, the thickness T of the sealing resin 69 is 150 μm. The humidity resistance of the sealing resin 69 is higher than that of the low dielectric constant material. However, if water permeates by a little amount through the sealing resin 69, there is a fear that the water permeates the insulating layer 12C, which is made of the low dielectric constant material and exposed on a side surface of the image pickup device chip 110, to lower reliability.

By contrast, as shown in FIG. 13, in the image pickup apparatus 1E, the cross sectional shape of the image pickup device chip 10, etc. is approximately rectangular, but a corner portion 19 facing a corner portion 79 of the inner wall of the shield case 70 is chamfered. Therefore, even when the radius of curvature R of the corner portion 79 is large, the thickness T of the sealing resin 69 can be made not greater than 100 μm except at the corner portion. The thickness T is preferably not greater than 50 μm and more preferably not greater than 25 μm.

Within the above range, there is not any fear that the reliability of the image pickup apparatus 1E is lowered by the permeation of water through the sealing resin 69.

Characteristics of the image pickup apparatus 1E are not deteriorated after the apparatus is left in a high temperature and high humidity environment, for example at temperature of 85° C. and humidity of 85% for 1000 hours.

It is noted that if a space in which the sealing resin 69 is not filled is formed between the image pickup device chip 10 and the shield case 70, the reliability of the image pickup apparatus is lowered. Therefore, the thickness T of the sealing resin 69 is preferably not smaller than 1 μm and more preferably not smaller than 5 μm.

As shown in FIG. 13, in a case where linear chamfering (so called as C chamfering) is performed, the corner portion 79 of the shield case 70 is machined to have the same radius of curvature R or to have a radius of curvature a little larger than the radius of curvature R, such as (R+0.05R).

As a matter of course, a curved chamfering (so called as R chamfering) may be performed and in that case, the corner portion 79 of the shield case 70 is machined to have the same radius of curvature R or to have a radius of curvature a little smaller than the radius of curvature R, such as (R−0.05R).

That is, it is preferable that a chamfering amount is within R±10% so as to make the thickness T of the sealing resin 69 small.

Since the image pickup apparatus 1E of the present embodiment is provided with the image pickup device chip 10 of the chip size package type, the apparatus has a small diameter, and the image pickup device chip 10 includes the insulating layer 12C made of the low dielectric constant material which does not have sufficient humidity resistance, but is protected by the shield case 70 and the sealing resin 69 having the predetermined thickness and therefore has high reliability.

Besides, in the image pickup apparatus 1E shown in FIG. 10, a side surface of the cover glass 30 is also covered by the shield case 70 and the sealing resin 69. In other words, the image pickup device chip 10 with the cover glass 30 adhered is housed in the shield case 70. However, it may be configured that at least the image pickup device chip 10 is housed in the shield case 70, and for example, a part of the cover glass 30 may be located outside of the shield case 70.

Further, in order to improve the reliability of the image pickup apparatus 1E, a so-called guard ring may be formed, which is made of the material selected from materials superior to the low dielectric constant material in humidity resistance so as to enclose the image pickup section 13, etc. on the first primary surface of the image pickup device chip 10, as in the image pickup apparatus 1 of the first embodiment. Even if water permeates from the side surface of the image pickup device chip 10, permeation of the water into inside of the guard ring is prevented.

Fifth Embodiment

Figure 15:
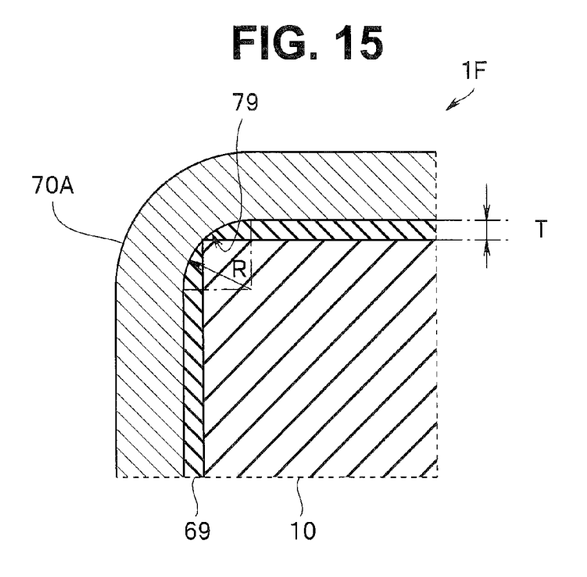
FIG. 15 is a partially enlarged sectional view of an image pickup apparatus according to a fifth embodiment.

Next, an image pickup apparatus 1F of the fifth embodiment will be described. The image pickup apparatus 1F is similar to the image pickup apparatus 1E, and therefore the same reference signs are assigned to the same elements and the description thereof is omitted.

As already described, in order to secure the reliability of the image pickup apparatus including the insulating layer 12C made of the low dielectric constant material, it is necessary to make the thickness of the sealing resin 69 not greater than 100 μm.

As shown in FIG. 15, in the image pickup apparatus 1F, the thickness of the sealing resin 69 is made not greater than 100 μm by setting the radius of curvature R of the cross sectional shape of the corner portion 79 of an inner wall of a shield case 70A to be not greater than 340 μm.

Specifically, in the image pickup apparatus 1F, the reliability is secured by performing precision machining of the shield case 70A instead of chamfering the corner portion of the image pickup device chip 10 (the cover glass 30).

Besides, the radius of curvature R of the corner portion 79 is preferably not greater than 170 μm such that the thickness T of the sealing resin is not greater than 50 μm, and is more preferably not greater than 85 μm such that the thickness T of the sealing resin is not greater than 25 μm.

The image pickup apparatus 1F has a small radius and high reliability as the image pickup apparatus 1E has, and further since the maximum thickness of the sealing resin is 100 μm or less, the image pickup apparatus 1F has reliability higher than the image pickup apparatus 1E.

As a matter of course, in order to make the reliability higher, it is needless to say that the corner portion of the image pickup device chip 10 (the cover glass 30) may be chamfered in the same manner as in the image pickup apparatus 1E, and the precision machining may be performed such that the radius of curvature R of the corner portion 79 of the inner wall of the shield case 70A is not greater than 340 μm.

Sixth Embodiment

Figure 16:
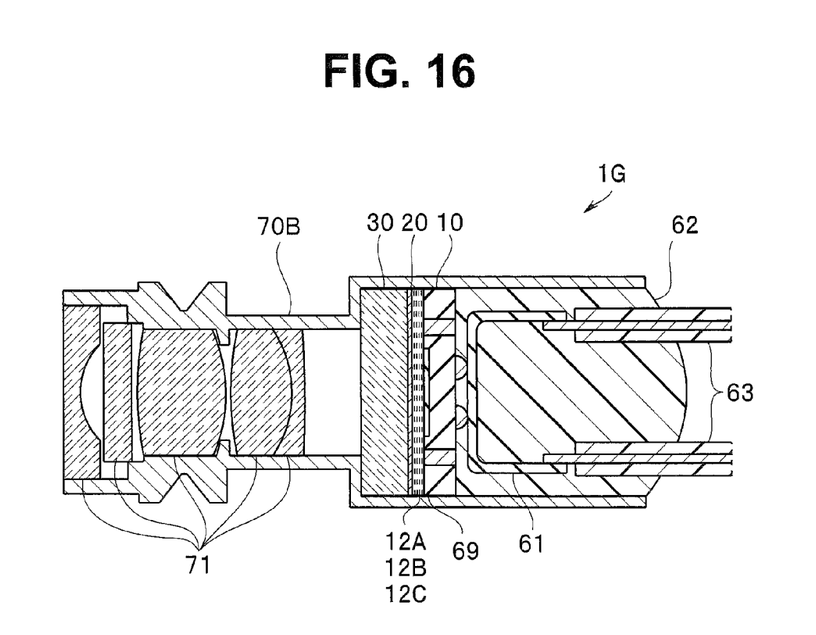
FIG. 16 is a cross sectional view of an image pickup apparatus according to a sixth embodiment.

Next, an image pickup apparatus 1G of the sixth embodiment will be described. The image pickup apparatus 1G is similar to the image pickup apparatuses 1E and 1F, and therefore the same reference signs are assigned to the same elements and the description thereof is omitted.

As shown in FIG. 16, the image pickup apparatus 1G is provided with an objective lens system 71 which is disposed in front of the cover glass 30. Further, a shield case 70B is integral with a lens frame of the objective lens optical system 71. That is, the shield case 70B is provided to be extended forward and an inner circumferential portion of an extended portion is in close contact with side surfaces of a lens group of the objective lens optical system 71.

It is noted that in FIG. 16, a rear part of the image pickup apparatus which is omitted in FIG. 10 is depicted. Particularly, signal cables 63 are joined to end portions of the wiring board 61. The signal cables 63 are connected to a processor (not shown) which performs control of the image pickup apparatus, etc. and also processing of image pickup signals.

In the image pickup apparatus 1G, the thickness of the sealing resin 69 is not greater than 100 μm as in the image pickup apparatuses 1E and 1F, and therefore the image pickup apparatus 1G has the same effects as those image pickup apparatuses. Further, the apparatus has higher reliability than the image pickup apparatuses 1E and 1F, since the extended portion of the shield case 70B also has a function of preventing the permeation of water.

The present invention is not limited to the above-described embodiments and may be subjected to various changes, modifications and the like within a range in which the gist of the present invention is not changed.

What is claimed is:

1. An image pickup apparatus comprising:
   an image pickup device chip having a first primary surface on which an image pickup section, a circuit section, electrode pads and a guard ring are formed, and a second primary surface on which junction terminals are formed, the circuit section transmitting and receiving a signal to and from the image pickup section and having a plurality of layers including an insulating layer that is made of a low dielectric constant material having a relative dielectric constant lower than silicon oxide, the electrode pads being connected with the circuit section, the guard ring enclosing the image pickup section, the circuit section and the electrode pads and being made of one or more materials selected from materials superior to the low dielectric constant material in humidity resistance, the junction terminals being connected with the electrode pads via through wirings;
   a transparent member adhered to the first primary surface of the image pickup device chip via a transparent adhesive layer and having the same dimensions as the image pickup device chip in a plan view; and
   a post ring disposed between an entire circumference of the guard ring and the transparent member and made of a material superior to a material of the guard ring in humidity resistance.

2. An image pickup apparatus comprising:
   an image pickup device chip having a first primary surface on which an image pickup section, a circuit section, electrode pads and a guard ring are formed, and a second primary surface on which junction terminals are formed, the circuit section transmitting and receiving a signal to and from the image pickup section and having a plurality of layers including an insulating layer that is made of a low dielectric constant material having a relative dielectric constant lower than silicon oxide, the electrode pads being connected with the circuit section, the guard ring enclosing the image pickup section, the circuit section and the electrode pads and being made of a material superior to the low dielectric constant material in humidity resistance, the junction terminals being connected with the electrode pads via through wirings; and a transparent member that is adhered to the first primary surface of the image pickup device chip via a transparent adhesive layer, and covers at least a region inside an outer periphery of the guard ring.

3. The image pickup apparatus according to claim 2, wherein the transparent member has the same dimensions as the image pickup device chip in a plan view.

4. The image pickup apparatus according to claim 3, wherein the guard ring is made of one or more materials selected from materials of the plurality of layers of the circuit section.

5. The image pickup apparatus according to claim 4, wherein a post ring is disposed between the guard ring and the transparent member, the post ring being made of a material superior to a material of the adhesive layer in humidity resistance, and dividing the adhesive layer.

6. An image pickup apparatus comprising:
an image pickup device chip having a first primary surface on which an image pickup section, a circuit section, junction electrodes and a guard ring are formed, the circuit section transmitting and receiving a signal to and from the image pickup section and having a plurality of layers including an insulating layer that is made of a low dielectric constant material having a relative dielectric constant lower than silicon oxide, the junction electrodes being connected with the circuit section, the guard ring enclosing the image pickup section, the circuit section and the junction electrodes and being made of a material superior to the low dielectric constant material in humidity resistance;
leads connected with the junction electrodes;
a sealing member that seals junction portions between the junction electrodes and the leads; and
a transparent member adhered to the first primary surface of the image pickup device chip via a transparent adhesive layer so as to cover a portion of the guard ring not covered by the sealing member.

7. The image pickup apparatus according to claim 6, wherein the guard ring is made of one or more materials selected from materials of the plurality of layers.

8. The image pickup apparatus according to claim 6, wherein the sealing member is made of epoxy resin or silicone resin.

9. The image pickup apparatus according to claim 6, wherein the sealing member is made of a light shielding material.

10. An image pickup apparatus comprising:
an image pickup device chip that has a rectangular shape in a plan view and has a first primary surface on which an image pickup section and a circuit section are formed, and a second primary surface on which junction terminals are formed, the circuit section transmitting and receiving a signal to and from the image pickup section and having a plurality of layers including an insulating layer that is made of a low dielectric constant material having a relative dielectric constant lower than silicon oxide, the junction terminals being connected with the circuit section via through wirings;
a cover glass adhered to the first primary surface of the image pickup device chip and having the same dimensions as the image pickup device chip in a plan view;
a shield case in which the image pickup device chip is housed, an inner wall of the shield case having a cross sectional shape formed by a curved line at a corner portion; and
a sealing resin that fills a gap between a side surface of the image pickup device chip and the shield case, the sealing resin having thickness not greater than 100 μm except the corner portion.

11. The image pickup apparatus according to claim 10, wherein the image pickup device chip is chamfered at a corner portion facing the corner portion of the inner wall of the shield case.

12. The image pickup apparatus according to claim 11, wherein a radius of curvature of a cross sectional shape of the corner portion of the inner wall is not greater than 340 μm.

13. The image pickup apparatus according to claim 11, further comprising an objective lens optical system disposed in front of the cover glass,
wherein the shield case is integral with a lens frame of the objective lens optical system.

14. The image pickup apparatus according to claim 12, further comprising an objective lens optical system disposed in front of the cover glass,
wherein the shield case is integral with a lens frame of the objective lens optical system.

* * * * *